(12) United States Patent
Takezawa et al.

(10) Patent No.: US 6,376,051 B1
(45) Date of Patent: Apr. 23, 2002

(54) MOUNTING STRUCTURE FOR AN ELECTRONIC COMPONENT AND METHOD FOR PRODUCING THE SAME

(75) Inventors: Hiroaki Takezawa, Osaka; Tsutomu Mitani, Hyogo; Minehiro Itagaki; Yoshihiro Bessho, both of Osaka; Kazuo Eda, Nara, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/519,984

(22) Filed: Mar. 7, 2000

(30) Foreign Application Priority Data

Mar. 10, 1999 (JP) ............................................. 11-062759
Jun. 2, 1999 (JP) ............................................. 11-155346

(51) Int. Cl.[7] .............................. B32B 3/00; B32B 15/08; B05B 1/00
(52) U.S. Cl. ...................... 428/209; 428/213; 428/216; 428/339; 428/457; 428/469; 156/273.3; 156/274.8; 156/275.5; 156/275.7; 156/327; 427/421
(58) Field of Search ................................ 428/209, 213, 428/216, 339, 457, 469; 427/421; 156/273.3, 274.8, 275.5, 275.7, 327

(56) References Cited

U.S. PATENT DOCUMENTS

| | | | | |
|---|---|---|---|---|
| 5,179,460 A | * | 1/1993 | Hinata et al. | 359/88 |
| 5,525,838 A | * | 6/1996 | Kaneko | 257/778 |
| 5,651,179 A | * | 7/1997 | Bessho et al. | 29/832 |
| 5,670,826 A | * | 9/1997 | Bessho et al. | 257/737 |
| 6,264,785 B1 | * | 7/2001 | Ikeda | 156/273.3 |

FOREIGN PATENT DOCUMENTS

| | | | |
|---|---|---|---|
| DE | 3638858 | * | 5/1987 |
| EP | 0645805 A | * | 3/1995 |
| JP | 59-172571 | | 9/1984 |

* cited by examiner

Primary Examiner—Deborah Jones
Assistant Examiner—Stephen Stein
(74) Attorney, Agent, or Firm—Merchant & Gould, P.C.

(57) ABSTRACT

In a mounting structure including a first electrode and a second electrode electrically connected to each other via a conductive adhesive, the periphery of an adhesion portion between at least one of the electrodes and the conductive adhesive is covered with an electrical insulating layer, whereby the adhesion portion is reinforced from the periphery. The electrical insulating layer may be formed by dissolving a binder resin component of the conductive adhesive in a solvent. This increases the concentration of a conductive filler in the conductive adhesive, so that the conductivity of the adhesion portion is also enhanced.

18 Claims, 21 Drawing Sheets

US 6,376,051 B1

MOUNTING STRUCTURE FOR AN ELECTRONIC COMPONENT AND METHOD FOR PRODUCING THE SAME

BACKGROUND OF THE INVENTION

1. Field of the Invention

The present invention relates to a solder-free mounting structure for an electronic component, in particular, a mounting structure for an electronic component using a conductive adhesive, and a method for producing the same.

2. Description of the Related Art

In recent years, due to increasing environmental awareness, there have been movements toward elimination of lead-containing solder used for mounting electronic components in the electronic industry.

Under such circumstances, a mounting technique using lead-free solder has been extensively developed, and partially put into practical use. However, the lead-free mounting technique has a number of problems, such as a large effect of an increase in mounting temperature on components with low heat-resistance and difficulty in realizing lead-free electrodes.

On the other hand, mounting using a conductive adhesive has been carried out in circumstances, particularly when restricted to small components such as chip components. More specifically, in addition to the advantage of using no lead, mounting using a conductive adhesive has the following advantages, so that it is expected as a potential technique in the future. First, the treatment temperature of a conductive adhesive is low (about 150° C.), compared with that of solder. Second, the specific gravity of a conductive adhesive is almost half that of solder, so that it is easier to render electronic equipment lightweight. Third, unlike solder, a conductive adhesive is not a metal material, so that metal fatigue does not occur, and resistance to repeated stress is outstanding.

Accordingly, by applying a mounting technique using a conductive adhesive to all the components, novel mounting can be expected, which satisfies environmental friendliness and high reliability.

However, a conductive adhesive has adhesion strength smaller than that of solder. Therefore, it is likely to be difficult to replace mounting using solder by mounting using a conductive adhesive. The reason why a conductive adhesive has smaller adhesion strength compared with solder is as follows. Mounting using solder utilizes a metallic bond with electrodes, whereas mounting using a conductive adhesive utilizes physical contact, a hydrogen bond, etc. with electrodes (which are relatively weak).

Conventionally, mounting using a conductive adhesive has been utilized for small components such as chip components. In this case, the mounted components are not likely to receive stress, so that the problem of small adhesion strength has not been raised. However, in particular, when packaged components, etc. (which are rapidly coming into widespread use in recent years) are mounted on printed-wiring substrates, small adhesion strength becomes a serious problem. For example, packaged components such as a Chip Size Package (CSP) and a Ball Grid Array (BGA) are more likely to receive stress compared with chip components. Therefore, there is a high possibility that poor connection occurs in mounting using a conductive adhesive. Stress applied to a mounting structure in which these packaged components are mounted on a printed-wiring substrate is roughly classified into two kinds: shearing stress and bending stress. The shearing stress is likely to be applied to an adhesion portion due to the difference in thermal expansion coefficient between a component and a printed-wiring substrate in the presence of thermal hysteresis. The bending stress is applied to a substrate due to an external force and the like.

Thus, in the case where mounting using a conductive adhesive is applied to all the electronic components, improvement of the adhesion strength becomes important.

In order to improve the adhesion strength of a conductive adhesive, a number of examples of improved adhesive materials have been reported as in JP 59-172571 A. However, it has been difficult to achieve the adhesion strength comparable to that of solder by simply improving adhesive materials.

Hereinafter, an example of a conventional mounting structure obtained by a mounting technique using a conductive adhesive will be described with reference to FIGS. 20 and 21.

Referring to FIG. 20, in the conventional mounting structure, an electrode 93 formed on a substrate 91 is electrically connected to an electrode 94 formed on a substrate 92 via a conductive adhesive 95. Such a mounting structure is obtained by coating the electrode 94 with the conductive adhesive 95, placing the substrate 91 in such a manner that the electrode 93 faces the surface of the conductive adhesive 95, and curing the conductive adhesive 95 by heating.

In the above-mentioned mounting structure, the conductive adhesive 95 is cured while substantially keeping its shape in coating. As a result, as shown in FIG. 21, binder resin 95a is present at the adhesion interface between the conductive adhesive 95 and the electrode 94 in a ratio substantially reflecting its mixture ratio in the conductive adhesive 95. This also applies to the adhesion interface between the conductive adhesive 95 and the electrode 93. Reference numeral 95b in FIG. 21 denotes a metal filler contained in the conductive adhesive 95.

However, the above-mentioned mounting using a conductive adhesive has been hindered from being put into practical use due to the following problems.

First, the adhesion strength in mounting using an adhesive conductive is smaller, compared with that in mounting using solder. One of the reasons for this is that, unlike mounting using solder, a fillet cannot be formed around adhesion interfaces by mounting using an adhesive conductive.

For example, in the conventional mounting structure shown in FIGS. 20 and 21, no binder resin 95a adheres to the side surfaces of the electrodes 93 and 94 and the peripheral portions thereof on the substrates 91 and 92. Accordingly, compared with molding using solder that enables a fillet to be formed around adhesion interfaces, adhesion strength is smaller in mounting using a conductive adhesive. Therefore, the adhesion portion obtained by mounting using a conductive adhesive is likely to be broken by an external force or heat stress, resulting in low adhesion reliability.

Second, in mounting using a conductive adhesive, electrodes are electrically connected to each other by way of contact with a filler in a conductive adhesive. Therefore, the connection resistance is greatly influenced by the state of contact.

For example, in the conventional mounting structure shown in FIG. 21, the binder resin 95a in the conductive adhesive 95 also is present at the adhesion interfaces between the conductive adhesive 95 and the electrodes 93 and 94 in a ratio substantially reflecting its mixture ratio in the conductive adhesive 95. Therefore, a large amount of the binder resin 95a at the adhesion interfaces may adversely affect the electrical connection, which renders the connection resistance high or unstable.

Thus, the conventional mounting using a conductive adhesive has been difficult to be put into practical use as an alternative to mounting using solder, due to insufficient reliability at the adhesion interfaces.

SUMMARY OF THE INVENTION

Therefore, with the foregoing in mind, it is an object of the present invention to provide a mounting structure in which adhesion strength and adhesion reliability are improved without using solder.

It is another object of the present invention to provide a mounting structure with high adhesion strength and low and stable connection resistance by improving adhesion reliability between a conductive adhesive and a metal electrode in solder-free molding using a conductive adhesive.

In order to achieve the above-mentioned objects, the first mounting structure of the present invention includes a first electrode and a second electrode electrically connected to each other via a conductive adhesive, wherein a periphery of an adhesion portion between at least one of the electrodes and the conductive adhesive is covered with an electrical insulating layer.

The second mounting structure of the present invention includes a conductive adhesive and a metal electrode electrically connected to each other, wherein the conductive adhesive contains a conductive filler and binder resin, a content of the conductive filler in the conductive adhesive is high in an adhesion portion between the conductive adhesive and the metal electrode, and a part of the binder resin flows and adheres to a periphery of the metal electrode.

According to the present invention, a method is provided for producing a mounting structure for an electronic component including a conductive adhesive and metal electrodes electrically connected to each other. The method includes: coating the metal electrodes with a solvent that dissolves binder resin in the conductive adhesive; coating the solvent with the conductive adhesive; and curing the conductive adhesive by heating so as to connect the metal electrodes to the conductive adhesive.

The first mounting structure of the present invention allows adhesion strength (which used to be small in conventional mounting using a conductive adhesive) to be remarkably improved by covering an adhesion portion with an electrical insulating layer, and hence, contributes to achievement of a solder-free mounting technique using a conductive adhesive.

The second mounting structure of the present invention allows adhesion strength between a conductive material contained in a conductive adhesive and a metal electrode to be enhanced, and low and stable connection resistance to be obtained. Furthermore, since binder resin adheres to the side surface of the metal electrode to form a fillet, a mounting structure with high adhesion strength can be obtained.

Furthermore, according to the production method of the present invention, in the step of curing a conductive adhesive by heating, binder resin contained in a portion of the conductive adhesive that is in contact with a solvent layer dissolves in the solvent layer and flows along an adhesion interface due to an interface effect. Consequently, the content of the binder resin contained in the conductive adhesive becomes low at the adhesion interface between the metal electrode and the conductive adhesive. Therefore, the adhesion strength between the conductive material contained in the conductive adhesive and the metal electrode is enhanced, whereby a mounting structure with lower and more stable connection resistance can be obtained, compared with a mounting structure obtained by a conventional method in which a metal electrode is directly connected to a conductive adhesive without using a solvent. Furthermore, the binder resin that is extruded along the adhesion interface adheres to the side surface of the metal electrode to form a fillet, so that adhesion strength can be remarkably enhanced, compared with the mounting structure obtained by the conventional method.

These and other advantages of the present invention will become apparent to those skilled in the art upon reading and understanding the following detailed description with reference to the accompanying figures.

DESCRIPTION OF THE PREFERRED EMBODIMENTS

Figure 1:
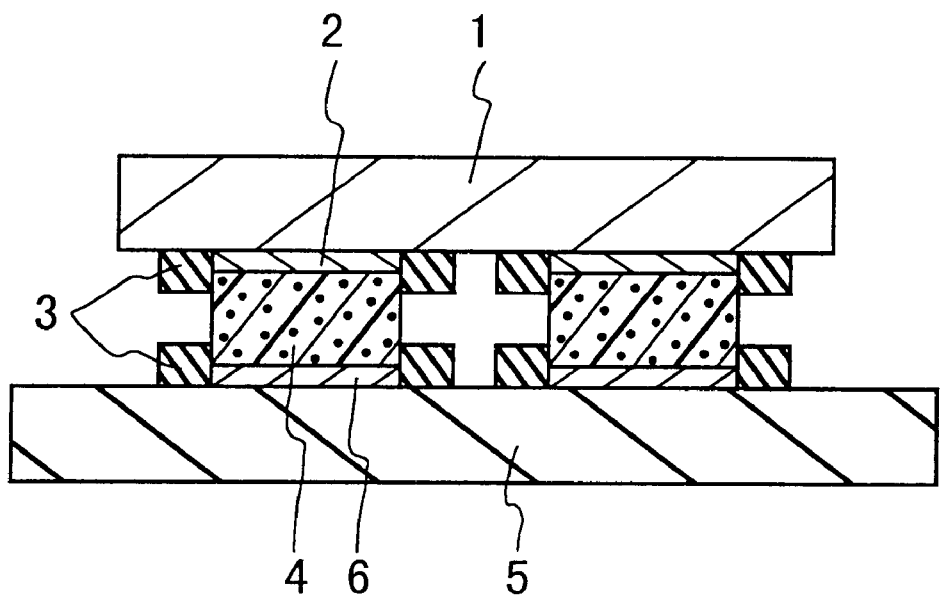
FIG. 1 is a sectional side view of a mounting structure of a first embodiment according to the present invention.

In the first mounting structure according to the present invention, it is preferable that an electrical insulating layer is formed of at least one material selected from the group consisting of ceramic and resin.

In the above-mentioned mounting structure, it is preferable that the electrical insulating layer is formed by binder resin from the conductive adhesive.

In the above-mentioned mounting structure, it is preferable that the first electrode is integrated with an electronic component and the electrical insulating layer also adheres to the electronic component.

In the above-mentioned mounting structure, it is preferable that the second electrode is integrated with a substrate, and the electrical insulating layer also adheres to the substrate.

In the above-mentioned mounting structure, it is preferable that there is a space between the electrical insulating layer covering the periphery of the adhesion portion between the first electrode and the conductive adhesive and the electrical insulating layer covering the periphery of an adhesion portion between the second electrode and the conductive adhesive, the conductive adhesive extends to the space, and the conductive adhesive in its extending portion adheres to the electrical insulating layer. It is preferable that the extending portion has a length of 50 μm to 300 μm.

In the above-mentioned mounting structure, it is preferable that a maximum height H of the conductive adhesive in a layered direction and a height H1 of the conductive adhesive in a layered direction in an adhesion portion between the conductive adhesive and the electrical insulating layer satisfy the relationship 0.01 H<H1<H/2 so as to obtain excellent adhesion reliability.

In the above-mentioned mounting structure, it is preferable that a maximum diameter D of the conductive adhesive in a plane direction and a diameter D1 of the conductive adhesive in a plane direction in the adhesion portion between the conductive adhesive and the electrode satisfy the relationship 1.01 D1<D<P/2 (where P denotes a connection pitch) so as to obtain excellent adhesion reliability.

In the above-mentioned mounting structure, it is preferable that the height of the electrical insulating layer seen in the cross-sectional direction thereof is in a range of 1 μm to 100 μm.

In the above-mentioned mounting structure, it is preferable that the thickness of the electrical insulating layer seen in the cross-sectional direction thereof is in a range of 1 μm to 100 μm.

In the above-mentioned mounting structure, it is preferable that the electrical insulating layer is formed continuously between adjacent electrodes.

In the second mounting structure according to the present invention, the content of a conductive filler in binder resin that has flowed and adhered to the periphery of the metal electrode is preferably lower than that in the adhesion portion between the conductive adhesive and the metal electrode. If the amount of the binder resin component is large at the periphery of the metal electrode, adhesion strength is enhanced, which results in an increased reinforcing effect.

In the above-mentioned mounting structure, the binder resin adhering to the periphery of the metal electrode is the one that dissolves in a solvent from the conductive adhesive. Accordingly, an electrically connected portion of the conductive adhesive is integrally formed with reinforcing resin that flows to the periphery of the connected portion, so that a reinforcing effect becomes high.

In the above-mentioned mounting structure, the binder resin is preferably thermosetting resin. This is because thermosetting resin realizes outstanding integration by adhesion and satisfactory heat resistance.

In the above-mentioned mounting structure, the cross-section of the binder resin that has flowed and adhered to the periphery of the metal electrode preferably has a shape spreading from the conductive adhesive to the metal electrode. This is because the reinforcing effect on the electrically connected portion of the conductive adhesive becomes high.

The above-mentioned solvent is preferably at least one selected from the group consisting of monovalent alcohols, ketones, esters, glycols, and glycol ethers.

Furthermore, the above-mentioned solvent preferably contains a component having a metal-adsorbing functional group or a functional group that chemically reacts with metal.

Because of this, when a solvent is formed in a layer shape on an electrode, the thickness of a solvent layer adhering to the electrode can be rendered large. Therefore, in the step of curing a conductive adhesive by heating, the amount of binder resin that dissolves in a solvent and is extruded from the adhesion interface is increased. As a result, the content of the binder resin at the adhesion interface is further decreased; and contact between the conductive adhesive and the electrode is improved, and more stable and lower connection resistance can be obtained. Furthermore, the amount of binder resin that is extruded to the periphery of the conductive adhesive along the adhesion interface and adheres to the electrode cross-section is increased, so that adhesion strength is further increased. The above-mentioned component having a metal-adsorbing functional group or a functional group that chemically reacts with metal preferably has at least one functional group selected from the group consisting of a hydroxyl group, a carboxyl group, a vinyl group, an epoxy group, an amino group, a methacryl group, a mercapto group, an iminodiacetic acid group, an iminodipropionic acid group, an ethylenediamine acetic acid group, and an aminocarboxyl group.

In the above-mentioned production method, the solvent preferably contains a component having a reducing property.

Because of this, an oxide film on an electrode is reduced at the adhesion interface between the metal electrode and the conductive adhesive. Therefore, lower connection resistance is obtained while adhesion strength is further increased.

The component having a reducing property is preferably at least one selected from the group consisting of reducing sugars, reducing vitamins, hydroxybenzenes, amines, formic acid, polyhydric alcohols, glycol ethers, hydrazines, Rochelle salt, acetoaldehyde, glyoxal, and hypophosphorous acid.

In the above-mentioned production method, it is preferable that coating of the solvent is conducted by spray coating.

In the above-mentioned production method, a coating amount of the solvent is set in a range of 0.01 mg to 1000 mg/cm$^2$, preferably 0.1 to 100/cm$^2$, and more preferably 1 to 20 mg/cm$^2$ so as to form a solvent layer.

In the above-mentioned production method, the mounting structure further includes a second electrode, and prior to curing the conductive adhesive, the second electrode is coated with a solvent that dissolves binder resin in a conductive adhesive, and a surface of the solvent on the second electrode is placed onto the conductive adhesive.

Embodiment 1

The present invention will be described by way of illustrative embodiments with reference to the drawings.

FIG. 1 shows the first mounting structure of the present invention. An electrode 2 on an electronic component 1 such as a CSP and a BGA is electrically connected to an electrode 6 on a substrate 5 via a conductive adhesive 4. Each periphery of adhesion portions between the electrode 2 and the conductive adhesive 4 and the electrode 6 and the conductive adhesive 4 is covered with an electrical insulating layer 3 (made of ceramic or resin).

Figure 2:
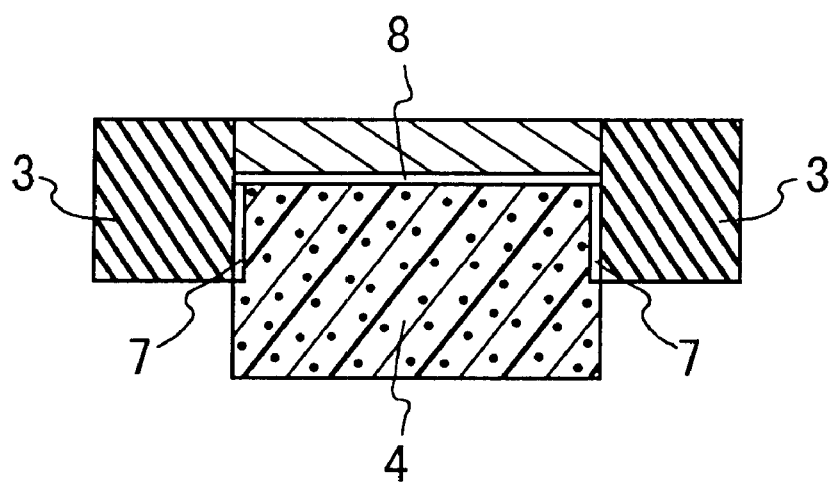
FIG. 2 is an enlarged view of an adhesion portion of the mounting structure of the first embodiment according to the present invention.

Because of the above, the first mounting structure has resistance to shearing stress and improved adhesion reliability, compared with a conventional mounting structure. The reason for this will be described with reference to FIG. 2 showing an enlarged adhesion portion between the electronic component and the conductive adhesive. When shearing stress is applied to the adhesion portion in the mounting structure, the shearing stress is almost absorbed by a contact portion 7 between the electrical insulating layer 3 and the conductive adhesive 4, whereby stress applied to an adhesion interface 8 between the conductive adhesive and the electrode becomes smaller than that in the conventional mounting structure.

Embodiment 2

Figure 3:
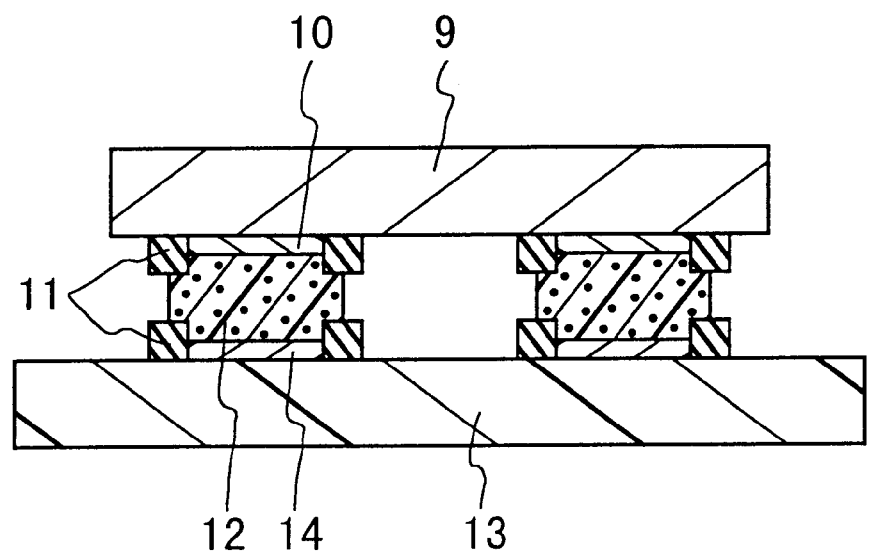
FIG. 3 is a sectional side view of a mounting structure of a second embodiment according to the present invention.
Figure 4:
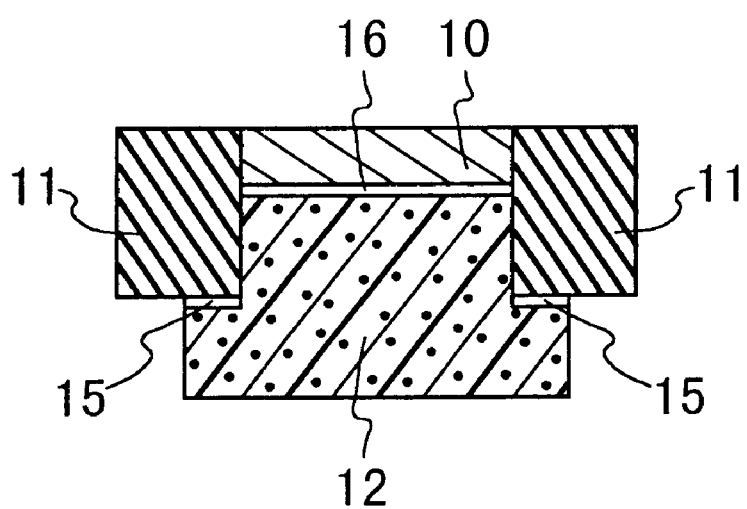
FIG. 4 is an enlarged view showing an adhesion portion of the mounting structure of the second embodiment according to the present invention.

FIG. 3 shows a second mounting structure of the present invention. The second mounting structure is identical with the first mounting structure except that a conductive adhesive 12 adheres to the surface of an electrical insulating layer 11 as well as the surfaces of an electrode 10 on an electronic component 9 and an electrode 14 on a substrate 13. Accordingly, the second mounting structure is more resistant to bending stress and has further improved adhesion reliability, compared with the first mounting structure. The reason for this will be described with reference to FIG. 4 showing an enlarged adhesion portion between the electronic component and the conductive adhesive. When bending stress is applied to the adhesion portion of the second mounting structure, the bending stress is almost absorbed by a contact portion 15 between the conductive adhesive 12 and the surface of the electrical insulating layer 11, whereby stress applied to an adhesion interface 16 between the conductive adhesive 12 and the electrode 10 becomes smaller than that of the first mounting structure.

In the first or second mounting structure of the present invention, it is preferable that a maximum height H of the conductive adhesive in a layered direction and a height H1 of the conductive adhesive in a layered direction in an adhesion portion between the conductive adhesive and the electrical insulating layer satisfy the relationship $0.01 H < H1 < H/2$, because adhesion reliability becomes most excellent in this case.

When H1 is equal to or smaller than 0.01 H, the contact area between the layered surface of the electrical insulating layer and the conductive adhesive is too small to absorb shearing stress satisfactorily, so that adhesion reliability is slightly decreased.

Furthermore, in the first or second mounting structure of the present invention, it is preferable that a maximum diameter D of the conductive adhesive in a plane direction and a diameter D1 of the conductive adhesive in a plane direction in the adhesion portion between the conductive adhesive and the electrode satisfy the relationship $1.01 D1 < D < P/2$ (where P denotes a connection pitch), because adhesion reliability becomes most excellent in this case.

When D is equal to or smaller than 1.01 D1, the contact area between the flat surface of the electrical insulating layer and the conductive adhesive is too small to absorb bending stress satisfactorily, so that adhesion reliability is slightly decreased.

Embodiment 3

Figure 9:
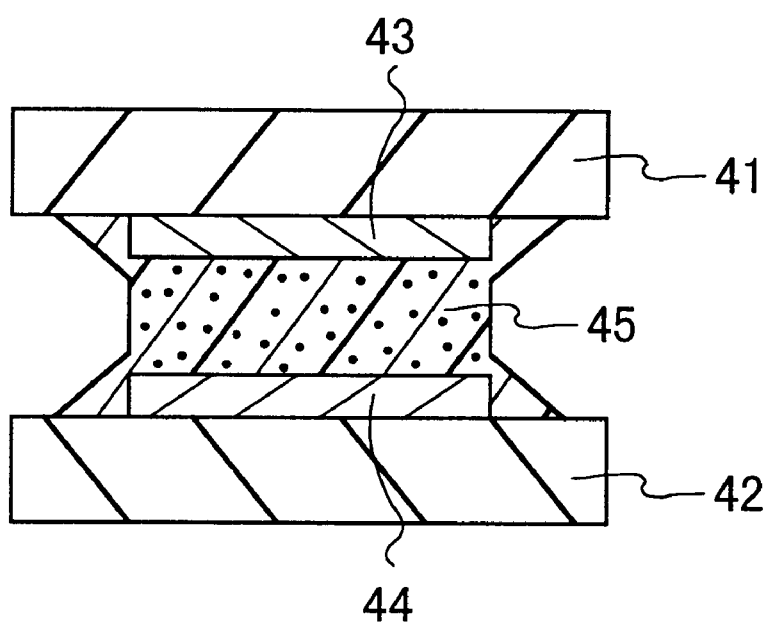
FIG. 9 is a sectional side view showing an example of a mounting structure of a third embodiment according to the present invention.

Referring to FIG. 9, in the mounting structure of Embodiment 3, metal electrodes 43 and 44 respectively formed on substrates 41 and 42 are electrically connected to each other via a conductive adhesive 45.

Figure 10:
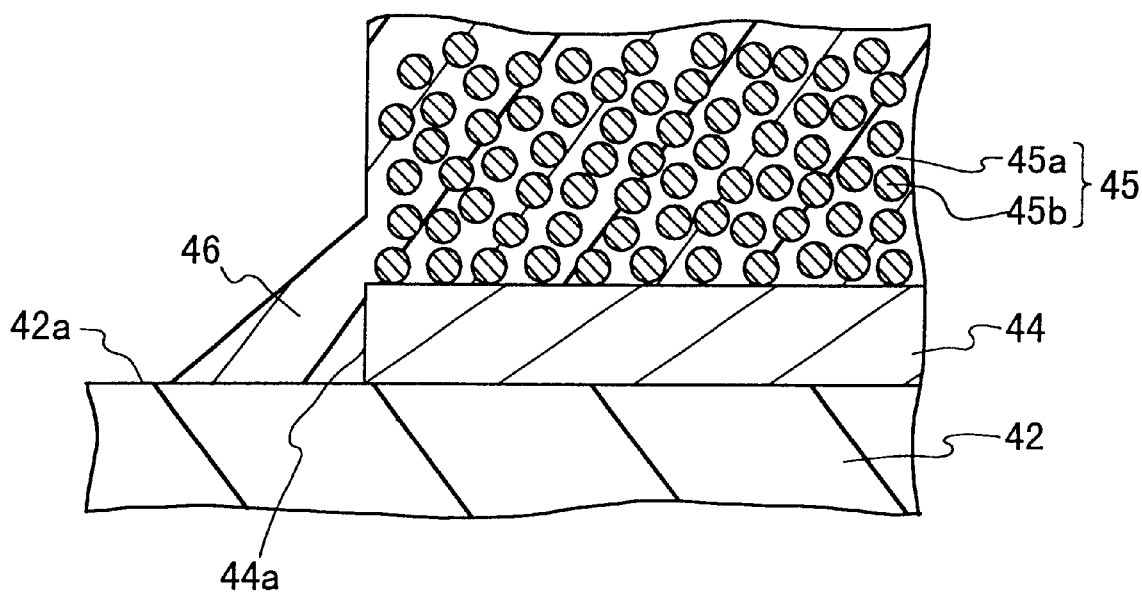
FIG. 10 is an enlarged view showing the vicinity of an adhesion interface between a metal electrode and a conductive adhesive in the mounting structure shown in FIG. 9.

FIG. 10 shows an enlarged vicinity of an adhesion interface between the metal electrode 44 and the conductive adhesive 45 in the mounting structure. As shown in FIG. 10, in the conductive adhesive 45, a metal filler 45b (conductive material) is kneaded into binder resin 45a. The binder resin 45a flowing from the conductive adhesive 45 adheres to a portion formed of a side part 44a of the metal electrode 44 and a peripheral part 42a of the metal electrode 44 on the substrate 42. Accordingly, a fillet 46 is formed. The fillet 46 is also provided at a portion formed of a side part of the metal electrode 43 and a peripheral part of the metal electrode 43 on the substrate 41. The content of the binder resin 45a in the fillet 46 is high.

Figure 11A:
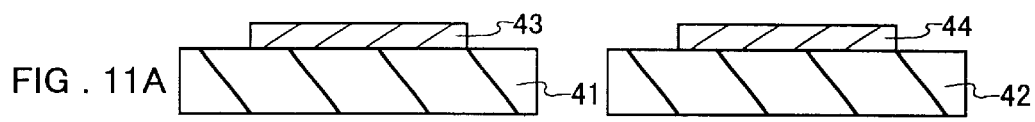
FIGS. 11A through 11E are cross-sectional views, each showing a main production step of the mounting structure shown in FIG. 9.
Figure 11B:
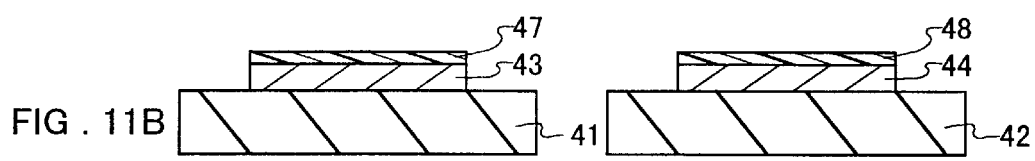
Figure 11C:
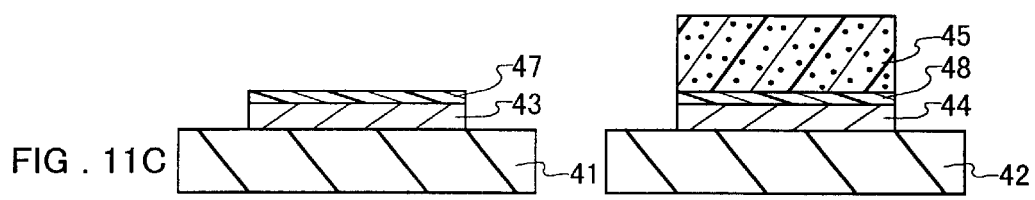
Figure 11D:
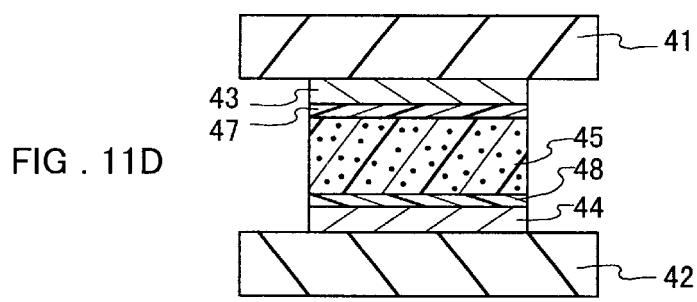

A production process of the mounting structure is as follows. First, as shown in FIG. 11A, metal electrodes 43 and 44 are formed on substrates 41 and 42, respectively. Then, solvent layers 47 and 48 are formed on the metal electrodes 43 and 44, respectively, as shown in FIG. 11B. Then, as shown in FIG. 11C, the surface of the solvent layer 48 formed on the metal electrode 44 is coated with a conductive adhesive 45. Thereafter, as shown in FIG. 11D, the substrate 41 is placed on the substrate 42 in such a manner that the metal electrode 47 faces the conductive adhesive 45. Then, the conductive adhesive 45 is cured by heating.

In heating, the binder resin 45a contained in portions of the conductive adhesive 45 that are in contact with the solvent layers 47 and 48 dissolves in the solvent layers 47 and 48. The dissolved binder resin 45a flows along the adhesion interfaces together with the solvent of the solvent layers 47 and 48 due to an interface effect and is extruded to the peripheries of the adhesion portions between the conductive adhesive 45 and the metal electrodes 43 and 44, thereby forming a fillet 46 as shown in FIG. 10.

Figure 11E:
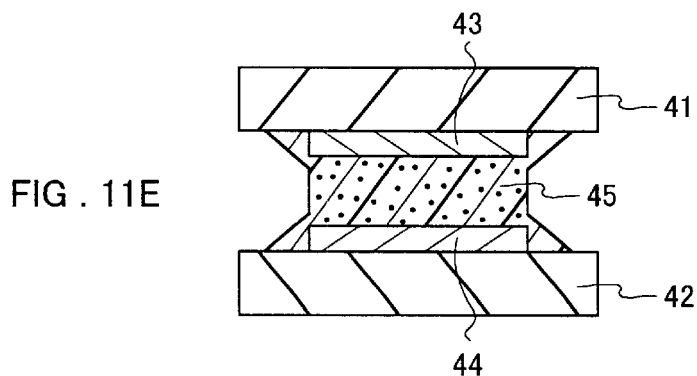

The solvent of the solvent layers 47 and 48 is extruded together with the binder resin 45a and evaporates during curing by heating. Therefore, as shown in FIG. 11E, the solvent layers 47 and 48 do not remain in the completed mounting structure.

Figure 20:
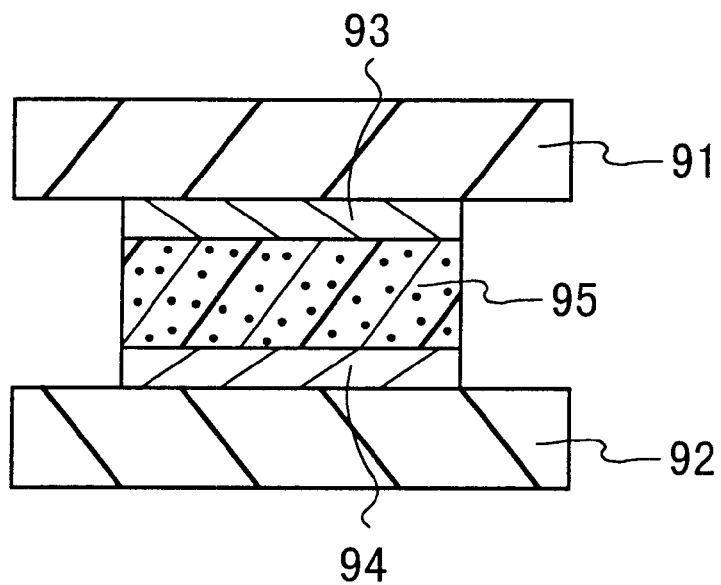
FIG. 20 is a sectional side view showing an example of a conventional mounting structure.
Figure 21:
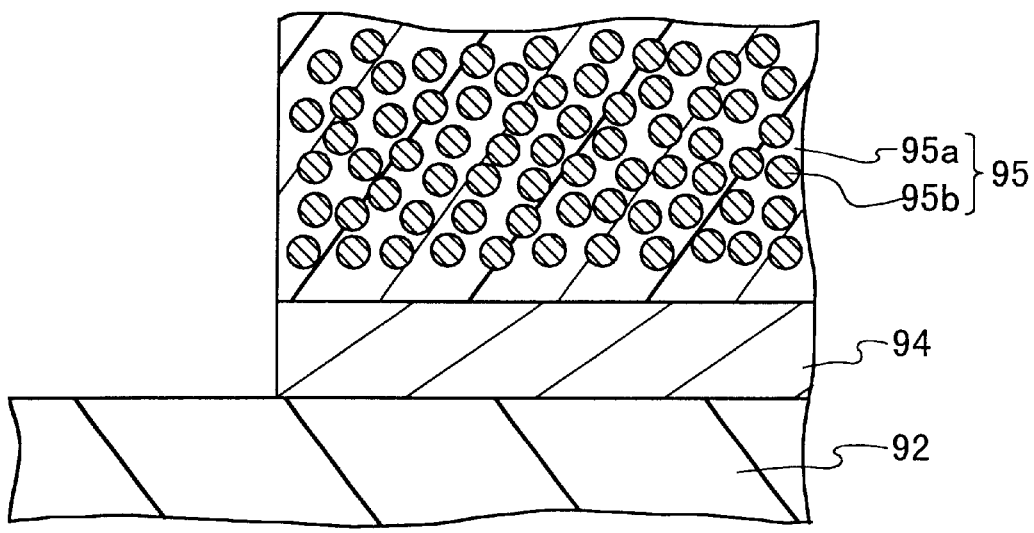
FIG. 21 is an enlarged view showing the vicinity of an adhesion interface between a metal electrode and a conductive adhesive in the conventional mounting structure shown in FIG. 20.

In the mounting structure, due to the fillet 46, adhesion strength is remarkably improved, compared with the conventional mounting structure without a fillet as shown in FIG. 20. Furthermore, as shown in FIG. 10, the content of the binder resin 45a in the conductive adhesive 45 is lowest on the interfaces between the conductive adhesive 45 and the metal electrode 43 and the conductive adhesive 45 and the metal electrode 44.

Accordingly, compared with the mounting structure obtained by a conventional method in which a metal electrode is directly connected to a conductive adhesive without forming a solvent layer, contact between the metal filler in the conductive adhesive and the metal electrode is improved, and connection resistance becomes low and stable. The solvent extruded together with the binder resin 45a evaporates by heat during curing, so that it will not adversely affect adhesion reliability.

Examples of the metal filler 45b in the conductive adhesive 45 include silver powder, nickel powder, and copper powder. As the binder resin 45a, those which mainly contain epoxy resin or the like can be used.

The solvent as used herein refers to a general organic solvent mainly used for removing oils and fats. Examples of the solvent include monovalent alcohols (methyl alcohol, ethyl alcohol, isopropyl alcohol, n-butanol, etc.), ketones (acetone, methyl ethyl ketone, etc.), esters (acetic acid n-butyl, etc.), glycols (ethylene glycol, diethylene glycol, propylene glycol, etc.), and glycol ethers (ethylene glycol monobutyl ether, ethylene glycol dibutyl ether, etc.).

Embodiment 4

The mounting structure of Embodiment 4 is identical with that of Embodiment 3 illustrated with reference to FIGS. 9, 10, and 11A to 11E, except that a solvent to be provided at the interface between a metal electrode and a conductive adhesive in the course of production contains a component having a metal-adsorbing functional group or a functional group that chemically reacts with metal. Accordingly, the present embodiment also will be described with reference to FIGS. 9, 10, and 11A to 11E used in Embodiment 3.

In the mounting structure of Embodiment 4, the solvent layers 47 and 48 shown in FIG. 11B and the like are formed by using a solvent containing a component having a metal-adsorbing functional group or a functional group that chemically reacts with metal. Because of this, the amount of the solvent that adheres to the metal electrodes 43 and 44 is increased, whereby the thickness of the solvent layers 47 and 48 can be rendered larger than that in Embodiment 3.

Accordingly, the amount of the binder resin 45a that is extruded to the periphery of the adhesion portion together with the solvent during heating becomes larger, compared with the mounting structure of Embodiment 3. Consequently, the content of the binder resin 45a at the adhesion interfaces between the metal electrode 43 and the conductive adhesive 45 and the metal electrode 44 and the conductive adhesive 45 is further decreased, whereby contact between the metal filler 45b and the metal electrodes 43 and 44 is further improved. As a result, more stable and lower connection resistance can be obtained, compared with the mounting structure in Embodiment 3.

Furthermore, the amount of the binder resin 45a that is extruded to the periphery of the adhesion interface to form the fillet 46 is increased. Therefore, compared with the mounting structure of Embodiment 2, adhesion strength between the conductive adhesive 45 and the metal electrodes 43 and 44 is improved.

As the metal-adsorbing functional group or functional group that chemically reacts with metal, at least one selected from the group consisting of a hydroxyl group, a carboxyl group, a vinyl group, an epoxy group, an amino group, a methacryl group, a mercapto group, an iminodiacetic acid group, an iminodipropionic acid group, an ethylenediamine acetic group, and an aminocarboxyl group can be used.

Embodiment 5

The mounting structure of Embodiment 5 is identical with that illustrated in Embodiments 3 and 4 with reference to FIGS. 9, 10, and 11A to 11E, except that a solvent to be provided at the adhesion interface between a metal electrode and a conductive adhesive in the course of production contains a component having a reducing property. Accordingly, the present embodiment also will be described with reference to FIGS. 9, 10, and 11A to 11E.

In the mounting structure of Embodiment 5, the solvent layers 47 and 48 as shown in FIG. 11B and the like are formed by using a solvent containing a reducing property. Because of this, an oxide film present on the electrodes 43 and 44 is reduced, so that connection resistance lower than that in Embodiment 3 or 4 is obtained, and adhesion strength is increased. The oxide film as used herein refers to, for example, a natural oxide film to be formed on the electrodes 43 and 44 when they are made of copper, etc., a natural oxide film that is further grown by heat during curing, and the like.

Examples of the component having a reducing property include at least one selected from the group consisting of reducing sugars, reducing a vitamins, hydroxybenzenes, amines, formic acid, polyhydric alcohols, glycol ethers, hydrazines, Rochelle salt, acetoaldehyde, glyoxal, and hypophosphorous acid.

EXAMPLES

Hereinafter, the present invention will be described more specifically by way of illustrative examples.

(Sample)

(1) Conductive adhesive: "NH-010A" (Trade name) produced by Nippon Handa Co., Ltd. "NH-010A" is made of a mixed composition containing a silver filler and epoxy resin.

(2) Mounting structure

Figure 5:
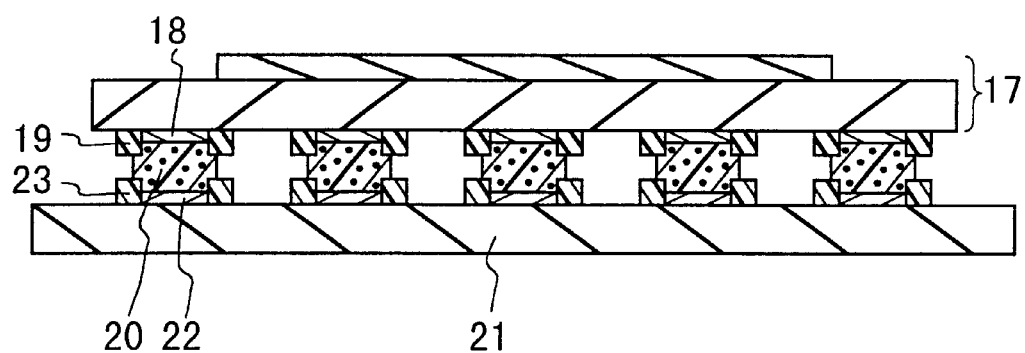
FIG. 5 is a sectional side view of a mounting structure used in Examples 1 to 8 according to the present invention.
Figure 6:
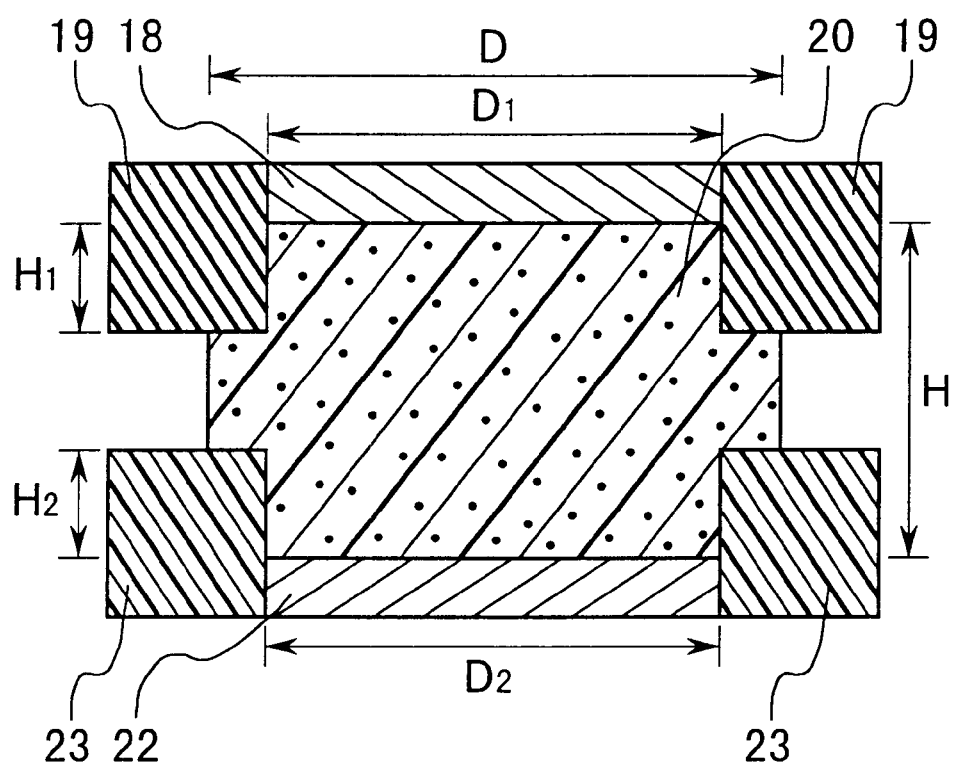
FIG. 6 is an enlarged view showing an adhesion portion of the mounting structure used in Examples 1 to 8 according to the present invention.

FIG. 5 shows a basic structure of a mounting structure used in the tests described later. FIG. 6 is an enlarged view for illustrating the dimensions of an adhesion portion thereof. Land electrodes 18 on a ceramic SCP 17 (10×10 mm) are electrically connected to land electrodes 22 on a mother substrate 21 (FR-4 (standard of glass epoxy substrate)) with a thickness of 0.8 mm via a conductive adhesive 20. Each periphery of adhesion portions between the land electrodes 18 and the conductive adhesive 20 is covered with a ceramic layer 19, and each periphery of adhesion portions between the land electrodes 22 and the conductive adhesive 20 is covered with a solder resist layer 23 (produced by Taiyo Yuden Co., Ltd.).

The details of the land electrode will be described below.

Land number: 10×10 (area array arrangement)

Land diameter: 0.5 mm

Land pitch: 1.0 mm

Land metal: Ni/Au-plated

In each example, a mounting structure with the above-mentioned basic constitution was evaluated under the condition that a maximum diameter D of the conductive adhesive in a plane direction and a maximum height H thereof in a layered direction are prescribed to be constant while varying either of the following:

Diameter of the conductive adhesive in the adhesion portion between the electrode and the conductive adhesive (D1: CSP side, D2: mother substrate side)

Height of the conductive adhesive in the adhesion portion between the electrical insulating layer and the conductive adhesive in a layered direction (H1: CSP side, H2: mother substrate side)

(Evaluation Method)

Test 1: Evaluation of Resistance to Shearing Stress

Shearing stress was applied to the adhesion portion by pressing the side face of the ceramic CSP in a direction orthogonal to the layered direction, and the force was measured when connection resistance increased by twice or more the initial value.

Test 2: Evaluation of Resistance to Bending Stress

Bending stress was applied to the adhesion portion by pressing the reverse face of the ceramic CSP from the reverse face of the mother substrate in the layered direction, and the force was measured when connection resistance increased by twice or more the initial value.

The connection resistance was obtained by measuring series resistance of the adhesion portions connected to each other by using a daisy-chain.

Table 1 shows the results.

TABLE 1

| | Dimension (μm) | | | | | Evaluation results (kgf) | |
|---|---|---|---|---|---|---|---|
| | Common portion | | CSP side | | Mother substrate side | | |
| | D | H | D1 | H1 | D2 | H2 | Test 1 | Test 2 |
| Example 1 | 500 | 100 | 500 | 10 | 500 | 0 | 15.5 | 2.5 |
| | 500 | 100 | 500 | 1.2 | 500 | 0 | 15.4 | 2.4 |
| Example 2 | 500 | 100 | 500 | 0 | 500 | 10 | 15.3 | 2.7 |
| | 500 | 100 | 500 | 0 | 500 | 1.2 | 15.4 | 2.7 |
| Example 3 | 500 | 100 | 500 | 10 | 500 | 10 | 33.4 | 2.6 |
| | 500 | 100 | 500 | 1.2 | 500 | 1.2 | 33.3 | 2.5 |
| Example 4 | 500 | 100 | 300 | 10 | 500 | 10 | 15.5 | 8.6 |
| | 500 | 100 | 495 | 10 | 500 | 10 | 15.4 | 8.6 |
| Example 5 | 500 | 100 | 500 | 10 | 300 | 10 | 15.4 | 8.7 |
| | 500 | 100 | 500 | 10 | 495 | 10 | 15.5 | 8.6 |
| Example 6 | 500 | 100 | 300 | 10 | 300 | 10 | 33.6 | 17.6 |
| | 500 | 100 | 495 | 10 | 495 | 10 | 33.3 | 17.7 |
| Example 7 | 500 | 100 | 500 | 0.8 | 500 | 0.8 | 10.9 | 2.5 |
| Example 8 | 500 | 100 | 498 | 10 | 498 | 10 | 33.5 | 7.5 |
| Example 9 | 500 | 100 | 300 | 10 | 300 | 10 | 33.5 | 17.5 |
| Comparative Example 1 | 500 | 100 | 500 | 0 | 500 | 0 | 4.9 | 2.5 |

Hereinafter, the above results will be described in detail.

Example 1

Using a conventional mounting structure (Comparative Example 1), the periphery of the adhesion portion between the conductive adhesive and the electrode on the CSP side was covered with an electrical insulating layer and H1 was set so as to satisfy $H1>0.01\,H$ (where $H=100$, $H1=10$ or $1.2$). As a result, resistance to shearing force was improved (Test 1) compared with Comparative Example 1.

Example 2

Using the conventional mounting structure (Comparative Example 1), the periphery of the adhesion portion between the conductive adhesive and the electrode on the mother substrate side was covered with an electrical insulating layer and H2 was set so as to satisfy $H2>0.01\,H$ (where $H=100$ and $H2=10$ or $1.2$). As a result, resistance to shearing force was improved with Comparative Example 1.

Example 3

Using the conventional mounting structure (Comparative Example 1), the peripheries of the adhesion portions between the conductive adhesive and the electrodes on both the CSP side and the mother substrate side were covered with an electrical insulating layer, and H1 and H2 were set so as to satisfy $H1>0.01\,H$ and $H2>0.01\,H$ (where $H=100$, $H1=10$, $H2=10$; or $H=100$, $H1=1.2$, $H2=1.2$). As a result, resistance to shearing stress was improved compared with Examples 1 and 2.

Example 4

Using the mounting structure of Example 1, the diameters of the electrical insulating layer in a plane direction on the CSP side was prescribed to be larger than that in Example 1, and D1 was set so as to satisfy $D>1.01\,D1$ (where $D=500$, $D1=300$ or $495$). As a result, resistance to bending stress (Test 2) was improved compared with Example 1.

Example 5

Using the mounting structure of Example 2, the diameter of the electrical insulating layer in a plane direction on the mother substrate side was prescribed to be larger than that in Example 1, and D2 was set so as to satisfy $D>1.01\,D2$ (where $D=500$, $D2=300$ or $495$). As a result, resistance to bending stress was improved compared with Example 2.

Example 6

Using the mounting structure of Example 3, the diameter of the electrical insulating layer in a plane direction on both the CSP side and the mother substrate side was prescribed to be larger than that in Example 3, and D1 and D2 were set so as to satisfy $D>1.01\,D1$ and $D>1.01\,D2$ (where $D=500$, $D1=300$, $D2=300$; or $D=500$, $D1=495$, $D2=495$). As a result, resistance to bending stress was improved compared with Example 3.

Example 7

Using the mounting structure of Example 3, when H1 and H2 were set so as to satisfy $H1<0.01\,H$ and $H2<0.01\,H$ (where $H=100$, $H1=H2=0.8$), the resistance to shearing stress was degraded compared with Example 3; however, it was more excellent than that of Comparative Example 1.

Example 8

Using the mounting structure of Example 6, when D1 and D2 were set so as to satisfy $D<1.01\,D1$ and $D<1.01\,D2$ (where D=500, D1=D2=498), the resistance to bending stress was degraded compared with Example 6; however, it was more excellent than that of Comparative Example 1.

Comparative Example 1

Figure 7:
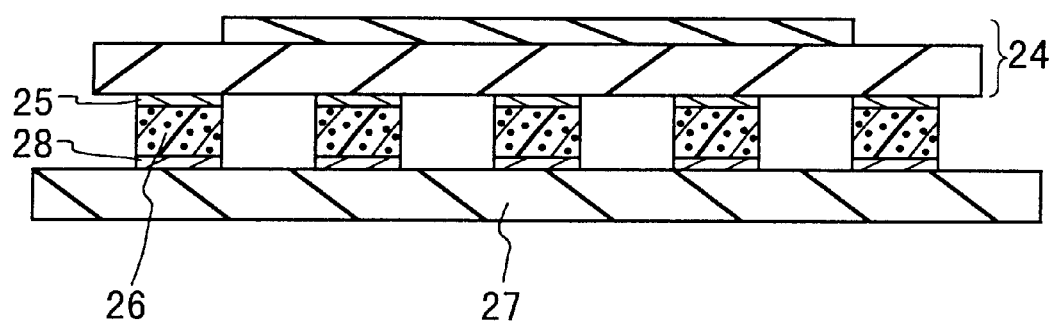
FIG. 7 is a sectional side view of a conventional mounting structure used in Comparative Example 1.

FIG. 7 shows a conventional mounting structure. In FIG. 7, electrodes 25 on a ceramic CSP 24 are connected to electrodes 28 on a mother substrate 27 via a conductive adhesive 26. There is no electrical insulating layer around the peripheries of adhesion portions between the conductive adhesive 26 and the electrodes 25 and 28, so that resistance to shearing stress and resistance to bearing stress are unsatisfactory, compared with Examples 1 to 8.

As described in Examples 1 to 8, the mounting structure of the present invention has improved resistance to stress (i.e., adhesion reliability), compared with the conventional mounting structure in Comparative Example 1. In particular, in Example 6, the peripheries of adhesion portions between the conductive adhesive and the electrodes are covered with an electrical insulating layer on both the CSP side and the mother substrate side, the conductive adhesive is allowed to adhere to the flat surface of the electrical insulating layer as well as the electrodes, and the dimension is set under predetermined conditions, whereby the most excellent reliability is obtained.

Example 9

Figure 8:
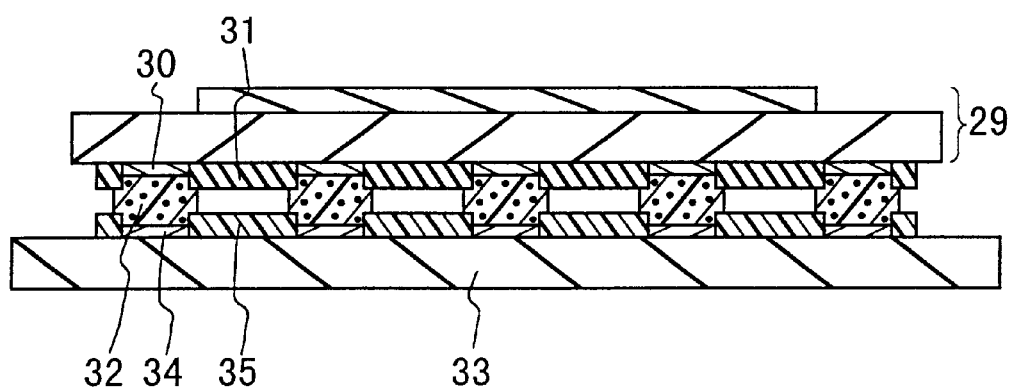
FIG. 8 is a sectional side view of a mounting structure used in Example 9 according to the present invention.

FIG. 8 shows a mounting structure used in Example 9. In Example 6, the electrical insulating layer is disposed only around the conductive adhesive, whereas in the mounting structure of Example 9, electrical insulating layers 31 and 35 are provided over the entire surfaces of a CSP 29 and a substrate 33 except for electrodes 30 and 34 (electrically connected to each other via a conductive adhesive 32). In this case, substantially the same results as those in Example 6 as shown in Table 1 were obtained.

In Example 9, only the mounting structure has been shown, in which a CSP is mounted on a mother substrate; however, it is appreciated that the present example is applicable to any other mounting. Other examples include mounting in which electronic components (chip components, bare chips, etc.) other than package components are mounted on a mother substrate, primary mounting in which a semiconductor chip in a package component is mounted on a carrier substrate, etc.

Example 10

Figure 12:
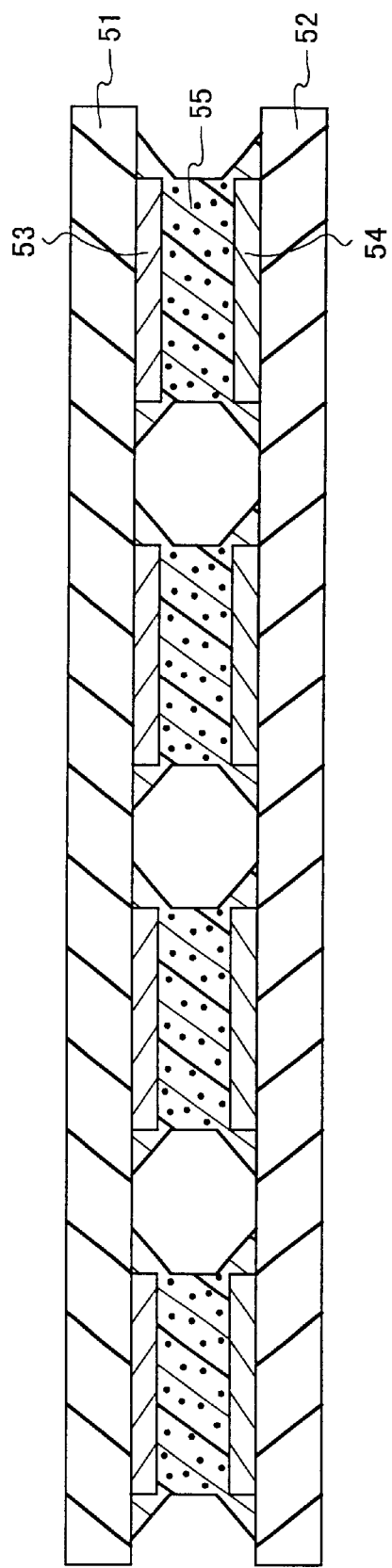
FIG. 12 is a sectional side view showing an example of a mounting structure of Example 10 according to the present invention.

As shown in FIG. 12, the mounting structure of Example 10 has a ceramic CSP 51 with metal electrodes 53 formed thereon and a mother substrate 52 with metal electrodes 54 formed thereon, and the metal electrodes 53 and 54 are electrically connected to each other via a conductive adhesive 55.

The mounting structure of Example 10 was produced as follows. First, a solvent (diethylene glycol dibutyl ether) was sprayed onto the surfaces of the metal electrodes 53 and 54. The resultant metal electrodes 53 and 54 were dried at 150° C. for 10 minutes, whereby a solvent layer was formed to a thickness of 5 $\mu$m in a coating amount of 5 mg/cm$^2$ on each surface of the metal electrodes 53 and 54.

Then, the conductive adhesive 55 was supplied to the surfaces of the solvent layers formed on the metal electrodes 54 by screen printing. Thereafter, the ceramic SCP 51 was placed on the mother substrate 52 in such a manner that the metal electrodes 53 faced the conductive adhesive 55. The layered structure thus obtained was heated at 150° C. for 30 minutes, whereby the conductive adhesive 55 was cured. At this time, the solvent layer flowed along the adhesion interface to evaporate due to the heat, so that the solvent layer did not remain in the completed mounting structure.

Figure 13:
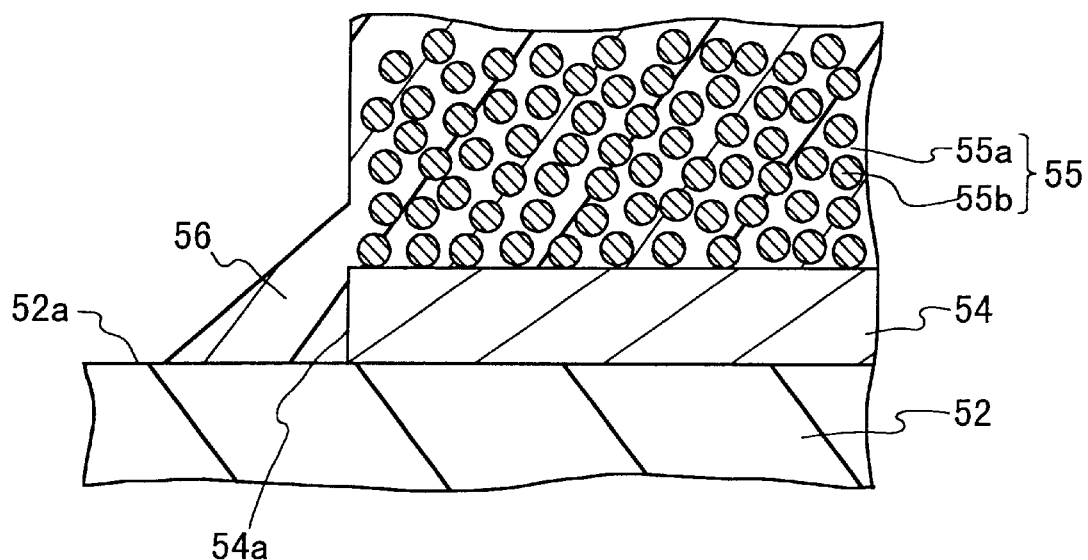
FIG. 13 is an enlarged view showing the vicinity of an adhesion interface between a metal electrode and a conductive adhesive in the mounting structure shown in FIG. 12.

As shown in FIG. 13, in the mounting structure of Example 10, binder resin 55a in the conductive adhesive 55 flowed along the adhesion interface between the conductive adhesive 55 and the metal electrode 54. Then, the binder resin 55a adhered to a portion formed of a side surface 54a of the metal electrode 54 and a surface 52a on the mother substrate 52 to form a fillet 56. Furthermore, the content of a conductive filler 55b in the conductive adhesive 55 became highest at the adhesion interfaces between the conductive adhesive 55 and the metal electrodes 53 and 54. In contrast, the content of the binder resin 55a in the fillet 56 was high.

In the present example, NH-010A (Trade name) produced by Nippon Handa Co., Ltd. was used as the conductive adhesive 55. The conductive adhesive 55 was a silver-type conductive adhesive containing silver powder as a metal filler in binder resin made of epoxy resin.

The detail of the constitution of the metal electrodes 53 and 54 is as follows.

Land number: 10×10 (lattice-shaped arrangement)

Land diameter: 0.5 mm

Land pitch: 1.0 mm

Land metal: Ni/Au-plated

The mounting structure of the present example produced as described above was evaluated for reliability in terms of adhesion strength and connection resistance as shown in the following Tests 3 and 4.

Test 3: Adhesion Strength Evaluation Test

The side face of the ceramic CSP was pressed in a direction orthogonal to a layered direction (i.e., in an in-plane direction of the ceramic CSP) after the mounting structure was fixed, whereby shearing stress was applied to the adhesion portion between the metal electrode and the conductive adhesive, and the force was measured when the adhesion portion was broken.

Test 4: Connection Resistance Evaluation Test

The mounting structure was placed in a temperature cycle test tank, whereby connection resistance was monitored. The test was conducted at −40° C. to 125° C., with each temperature being kept for 30 minutes (one cycle). The test was conducted up to 1000 cycles. The connection resistance was obtained by measuring series resistance of adhesion portions connected to each other by using a daisy-chain.

For comparison, a mounting structure (Comparative Example 2) was produced by a conventional method in which a metal electrode is directly connected to a conductive adhesive without using a solvent. The mounting structure was subjected to the tests under the same conditions as the above.

Comparative Example 2

Using the same materials as those of the mounting structure of Example 10, electrodes were directly connected to a conductive adhesive, whereby a mounting structure was produced. Comparative Example 2 is different from Example 10 in that a solvent layer was not formed on the electrodes, and the electrodes were directly connected to the conductive adhesive in the course of production.

Figure 14:
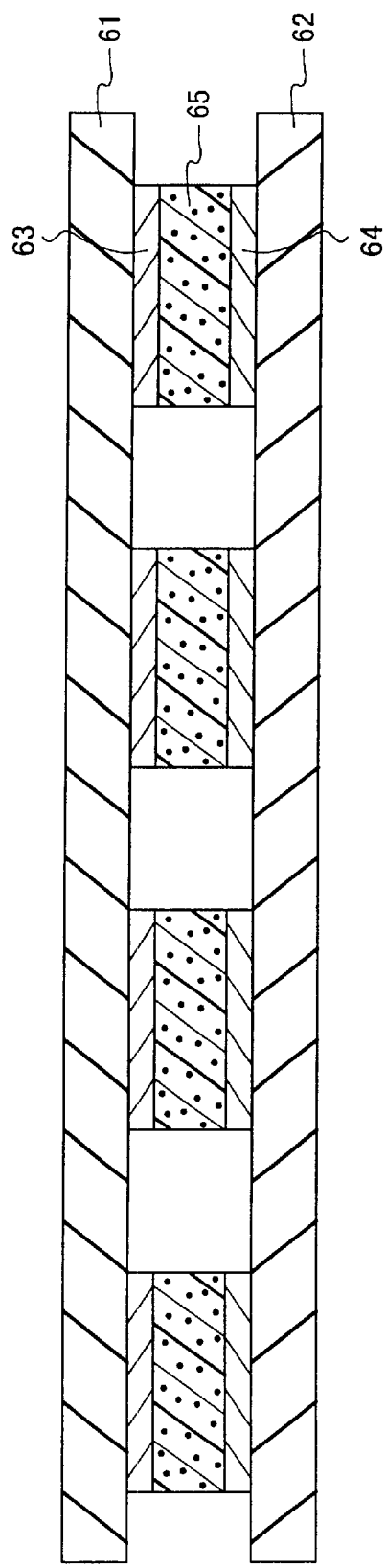
FIG. 14 is a sectional side view showing a conventional mounting structure as a comparative example of the mounting structure shown in FIG. 12.

In the mounting structure of Comparative Example 2, as shown in FIG. 14, a conductive adhesive 65 (containing binder resin 65a and a metal filler 65b) was cured while keeping its shape in coating. The binder resin 65a was not found to flow along the adhesion interfaces between the conductive adhesive 65 and metal electrodes 63 on a CSP 61 and electrodes 64 on a substrate 62.

Figure 15:
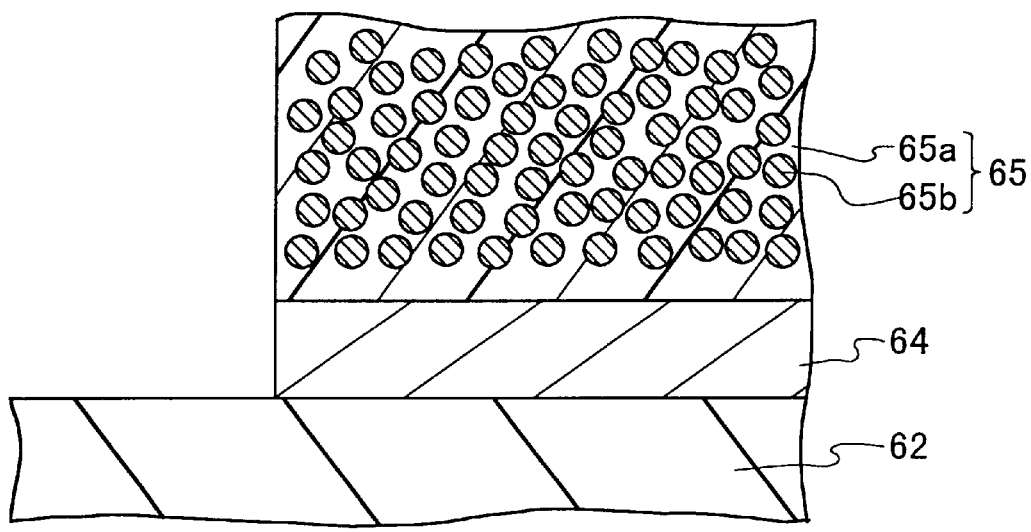
FIG. 15 is an enlarged view showing the vicinity of an adhesion interface between a metal electrode and a conductive adhesive in the conventional mounting structure shown in FIG. 14.

As shown in FIG. 15, in the mounting structure of Comparative Example 2, the content of the binder resin 65a in the conductive adhesive 65 was substantially uniform at the adhesion interfaces between the conductive adhesive 65 and the metal electrodes 63 and 64 and in the other portions. More specifically, a relatively large amount of the binder resin 65a was present even at the adhesion interfaces between the conductive adhesive 65 and the metal electrodes 63 and 64.

The result of Test 3 of Comparative Example 2 was 10.4 kgf, and the result of Test 4 thereof was 12.5Ω (increased at the 25th cycle). In contrast, the result of Test 3 of Example 10 was 17.4 kgf, and the result of Test 4 thereof was 7.5Ω (increased at the 667th cycle)

More specifically, it is understood that in the mounting structure of Example 10, adhesion strength was improved, and connection resistance was decreased and stabilized, compared with the mounting structure of Comparative Example 2 by the conventional mounting method.

In the present example, diethylene glycol dibutyl ether was used as a solvent. However, monovalent alcohols (methyl alcohol, ethyl alcohol, isopropyl alcohol, n-butanol, etc.), ketones (acetone, methyl ethyl ketone, etc.), esters (acetic acid n-butyl, etc.), glycols (ethylene glycol, diethylene glycol, propylene glycol, etc.), or glycol ethers (ethylene glycol monobutyl ether, ethylene glycol dibutyl ether, etc.) may be used.

In the present example, a silver filler was used as a filler for the conductive adhesive. However, a nickel filler, a copper filler, a silver-palladium filler, or a silver-coated copper filler may be used. Furthermore, as the binder resin, epoxy resin was used. However, acrylic resin, silicon resin, etc. may be used.

Example 11

A mounting structure was produced in the same way as in Example 10, by using 100 parts of the solvent (diethylene glycol dibutyl ether) used in Example 10 with 5 parts of iminodiacetic acid added thereto as a component having a metal-adsorbing functional group or a functional group that chemically reacts with metal.

Observation of the resultant mounting structure revealed that, in the same way as in Example 10, the binder resin in the conductive adhesive flowed along the adhesion interface to adhere to the cross-section of the electrode, thereby forming a fillet. It was also found that the content of the binder resin in the conductive adhesive was lowest at the adhesion interface.

The results of Tests 3 and 4 of the mounting structure of Example 11 were 23.6 kgf, and 5.3Ω (increased at the 779th cycle), respectively. It is understood from these results that the mounting structure of the present example had its adhesion strength improved and its connection resistance decreased and stabilized, compared with those of Comparative Example 2 and Example 10.

In the present example, diethylene glycol dibutyl ether was used as a solvent. However, monovalent alcohols (methyl alcohol, ethyl alcohol, isopropyl alcohol, n-butanol, etc.), ketones (acetone, methyl ethyl ketone, etc.), esters (acetic acid n-butyl, etc.), glycols (ethylene glycol, diethylene glycol, propylene glycol, etc.), or glycol ethers (ethylene glycol monobutyl ether, ethylene glycol dibutyl ether, etc.) may be used.

In the present example, a silver filler was used as a filler for the conductive adhesive. However, a nickel filler, a copper filler, a silver-palladium filler, or a silver-coated copper filler may be used. Furthermore, as the binder resin, epoxy resin was used. However, acrylic resin, silicon resin, etc. may be used.

Furthermore, in the present example, as a component having a metal-adsorbing functional group or a functional group that chemically reacts with metal, iminodiacetic acid was used. However, a component having at least one functional group selected from a hydroxyl group, a carboxyl group, a vinyl group, an epoxy group, an amino group, a methacryl group, a mercapto group, an iminodiacetic acid group, an iminodipropionic acid group, an ethylenediamine acetic acid group, and an aminocarboxyl group may be used.

Example 12

A mounting structure was produced in the same way as in Example 10, by using 100 parts of the solvent (diethylene glycol dibutyl ether) used in Example 10 with 5 parts of ascorbic acid added thereto as a component having a reducing property.

Observation of the resultant mounting structure revealed that, in the same way as in Example 10, the binder resin in the conductive adhesive flowed along the adhesion interface to adhere to the cross-section of the electrode, thereby forming a fillet. It was also found that the content of the binder resin in the conductive adhesive was lowest at the adhesion interface.

The results of Tests 3 and 4 of the mounting structures of the present example were 25.8 kgf, and 3.7Ω (increased at the 995th cycle), respectively. It is understood from these results that the mounting structure of the present example had its adhesion strength further improved and its connection resistance further decreased and stabilized, compared with those of Comparative Example 2 and Examples 10 and 11.

In the present example, diethylene glycol dibutyl ether was used as a solvent. However, monovalent alcohols (methyl alcohol, ethyl alcohol, isopropyl alcohol, n-butanol, etc.), ketones (acetone, methyl ethyl ketone, etc.), esters (acetic acid n-butyl, etc.), glycols (ethylene glycol, diethylene glycol, propylene glycol, etc.), or glycol ethers (ethylene glycol monobutyl ether, ethylene glycol dibutyl ether, etc.) may be used.

In the present example, a silver filler was used as a filler for the conductive adhesive. However, a nickel filler, a copper filler, a silver-palladium filler, or a silver-coated copper filler may be used. Furthermore, as the binder resin, epoxy resin was used. However, acrylic resin, silicon resin, etc. may be used.

Furthermore, in the present example, ascorbic acid was used as a component having a reducing property. However, at least one selected from reducing sugars, reducing vitamins, hydroxybenzenes, amines, formic acid, polyhydric alcohols, glycol ethers, hydrazines, Rochelle salt, acetoaldehyde, gluoxal, and hypophosphorous acid may be used.

Example 13

Figure 16:
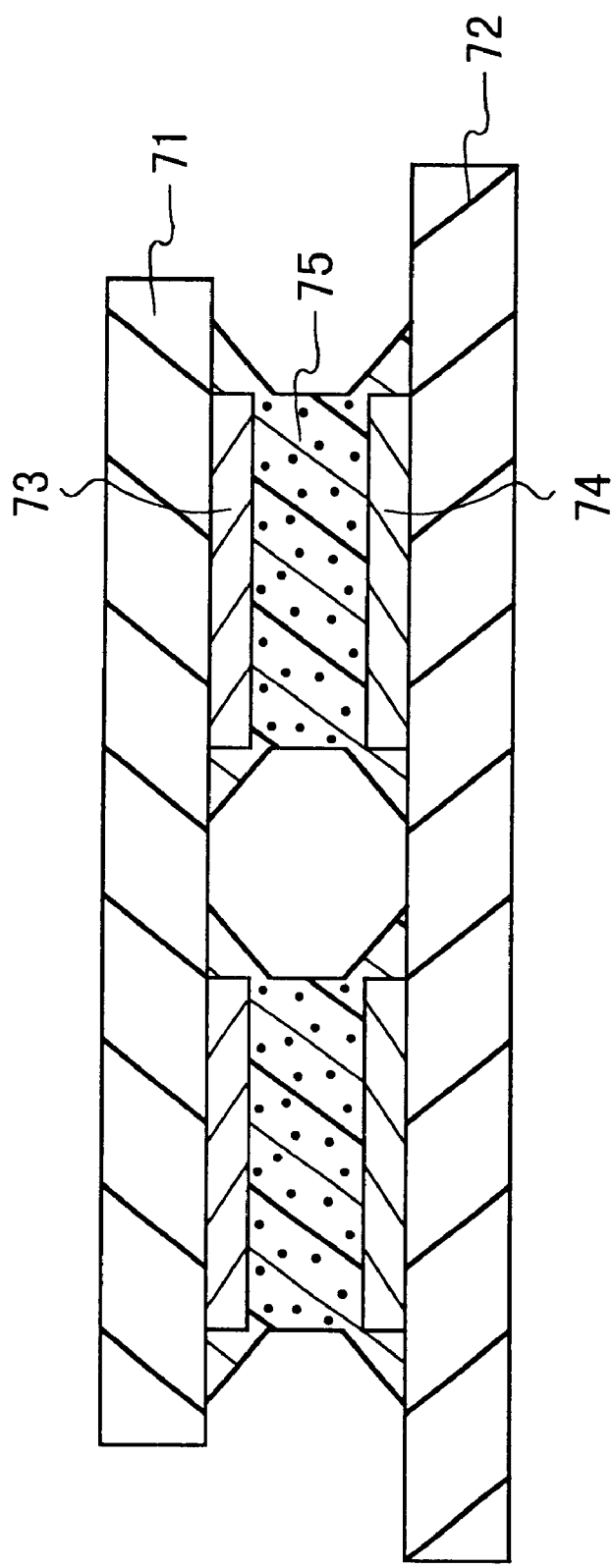
FIG. 16 is a sectional side view showing an example of a mounting structure of Example 13 according to the present invention.

In the mounting structure of Example 13, as shown in FIG. 16, metal electrodes 73 on a ceramic chip capacitor (size 3012) 71 are electrically connected to metal electrodes 74 on a mother substrate 72 via a conductive adhesive 75 (containing a conductive adhesive 75a and a metal filler 75b).

The mounting structure of Example 13 was produced as follows. First, a solvent (diethylene glycol dibutyl ether) was sprayed onto the surfaces of the metal electrodes 73 and 74. The resultant layered structures were dried at 150° C. for 10 minutes, whereby a solvent layer was formed to a thickness of 5 μm in a coating amount of 5 mg/cm² on each surface of the metal electrodes 73 and 74.

Next, the conductive adhesive 75 was supplied to the surfaces of the solvent layers formed on the metal electrodes 74 by screen printing. Thereafter, the ceramic chip capacitor 71 was placed on the mother substrate 72 in such a manner that the metal electrodes 73 faced the conductive adhesive 75. The layered structure thus obtained was heated at 150° C. for 30 minutes, whereby the conductive adhesive 75 was cured. At this time, the solvent layer flowed along the adhesion interface to evaporate due to the heat, so that the solvent layer did not remain in the completed mounting structure.

Figure 17:
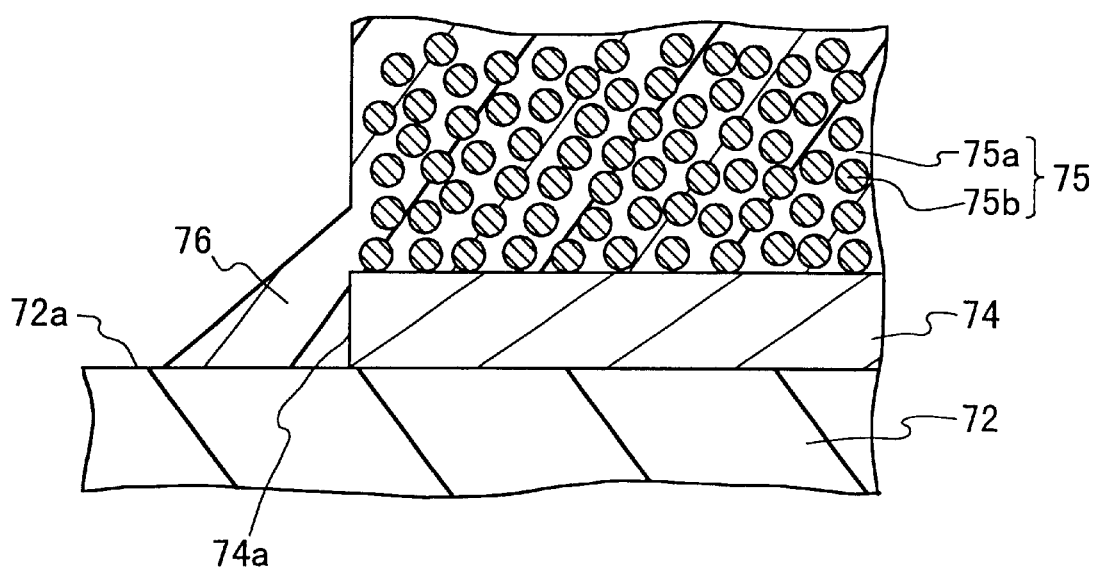
FIG. 17 is an enlarged view showing the vicinity of an adhesion interface between a metal electrode and a conductive adhesive in the mounting structure shown in FIG. 16.

As shown in FIG. 17, in the mounting structure of the present example, the binder resin 75a in the conductive adhesive 75 flowed along the adhesion interface between the conductive adhesive 75 and the metal electrode 74. Then, the binder resin 75a adhered to a side surface 74a of the metal electrode 74 and a peripheral portion 72a on the mother substrate 72 to form a fillet 76. The fillet was also formed on the ceramic chip capacitor 71 in the same way as on the mother substrate 72. Furthermore, the content of the binder resin 75a in the conductive adhesive 75 became lowest at the adhesion interfaces between the conductive adhesive 75 and the metal electrodes 73 and 74.

The conductive adhesive used in the present example is the same as that in Example 10. Furthermore, the constitution of the metal electrodes 73 and 74 is the same as that in Example 10.

For comparison, a mounting structure (Comparative Example 3) was produced by a conventional method in which metal electrodes are directly connected to a conductive adhesive without using a solvent.

Comparative Example 3

Figure 18:
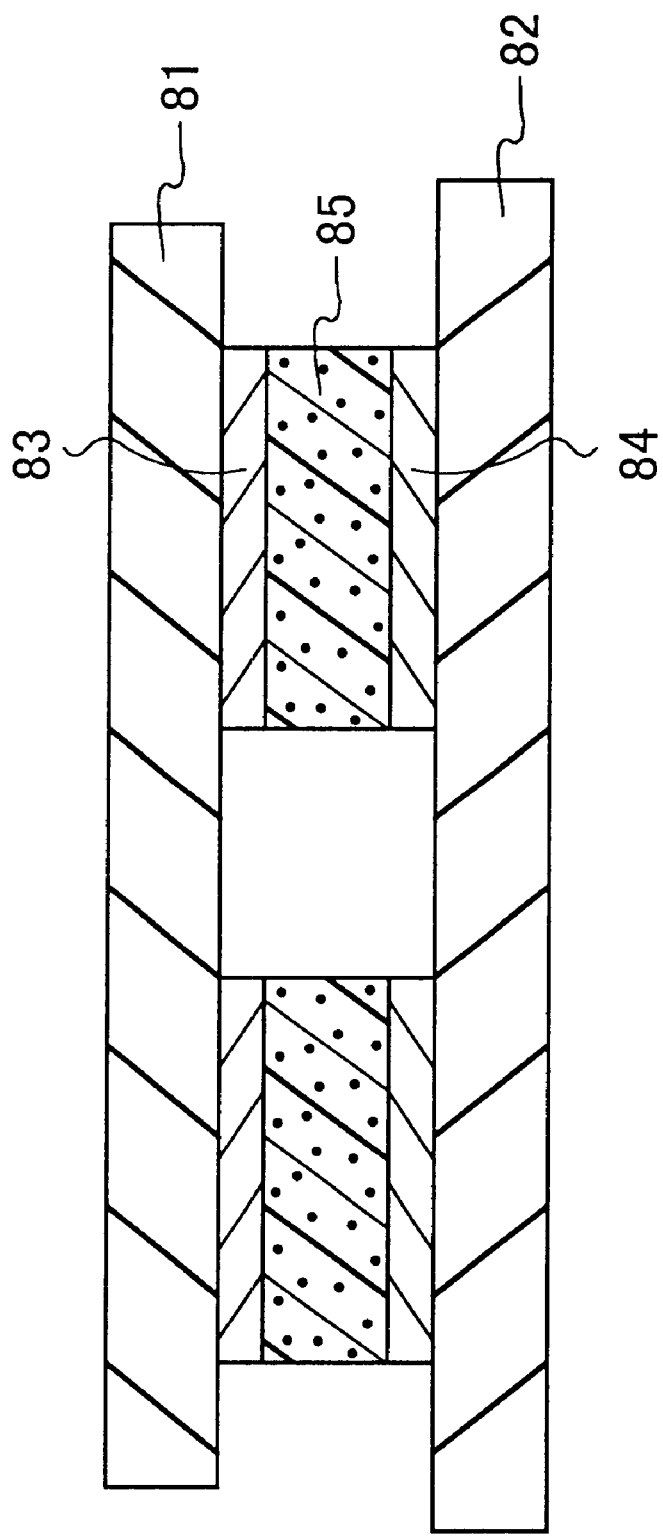
FIG. 18 is a sectional side view showing a conventional mounting structure as a comparative example of the mounting structure shown in FIG. 16.

Using the same materials as those in Example 13, as shown in FIG. 18, a mounting structure was produced, in which metal electrodes 83 on a ceramic chip capacitor (size 3012) 81 are electrically connected to metal electrodes 84 on a mother substrate 82 via a conductive adhesive 85 (containing a conductive adhesive 85a and a metal filler 85b). The mounting structure of Comparative Example 3 is different from that of Example 13 in that an electrode was directly connected to a conductive adhesive without forming a solvent layer on the electrode in the course of production.

In the mounting structure of Comparative Example 3 thus obtained, as shown in FIG. 18, the conductive adhesive 85 was cured while keeping its shape in coating, and no binder resin was found to flow along the adhesion interfaces between the metal electrodes and the conductive adhesive.

Figure 19:
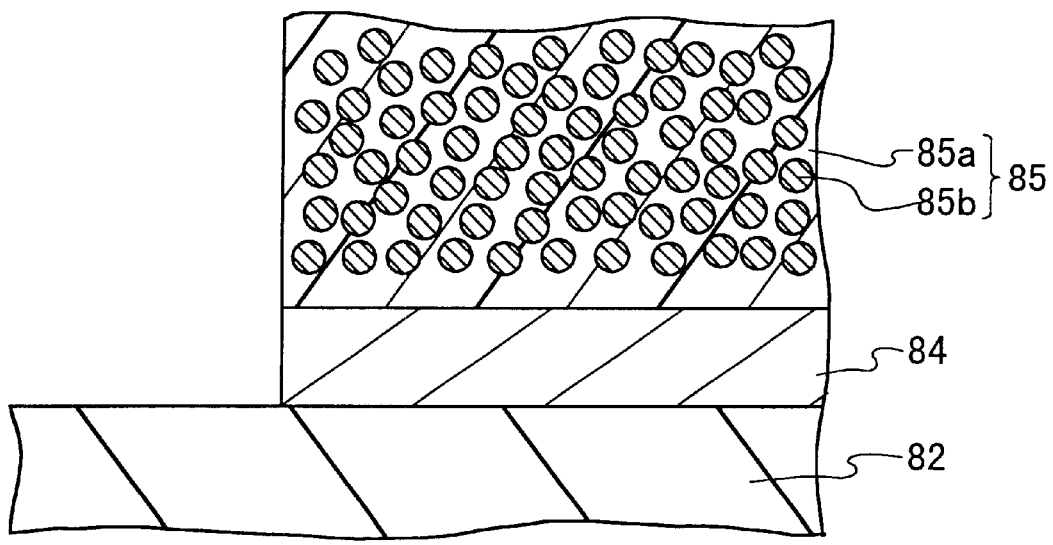
FIG. 19 is an enlarged view showing the vicinity of an adhesion interface between a metal electrode and a conductive adhesive in the conventional mounting structure shown in FIG. 18.

As shown in FIG. 19, in the mounting structure of Comparative Example 3, the content of binder resin 85a in the conductive adhesive 85 was substantially uniform at the adhesion interfaces between the conductive adhesive 85 and the metal electrodes 83 and 84, and in the other portions. More specifically, a relatively large amount of the binder resin 85a was present even at the adhesion interfaces between the conductive adhesive 85 and the metal electrodes 83 and 84.

The mounting structures of Example 13 and Comparative Example 3 were subjected to Tests 3 and 4. The result of Test 3 of Comparative Example 3 was 3.5 kgf, and the result of Test 4 thereof was 0.45Ω (increased at the 750th cycle). In contrast, the result of Test 3 of Example 13 was 10.4 kgf, and the result of Test 4 thereof was 0.12Ω (stable until the 1000th cycle)

More specifically, it was confirmed that in the mounting structure of Example 13, adhesion strength was improved, and connection resistance was decreased and stabilized, compared with the conventional mounting structure of Comparative Example 3.

In Example 13, diethylene glycol dibutyl ether was used as a solvent. However, monovalent alcohols (methyl alcohol, ethyl alcohol, isopropyl alcohol, n-butanol, etc.), ketones (acetone, methyl ethyl ketone, etc.), esters (acetic acid n-butyl, etc.), glycols (ethylene glycol, diethylene glycol, propylene glycol, etc.), or glycol ethers (ethylene glycol monobutyl ether, ethylene glycol dibutyl ether, etc.) may be used.

In Example 13, a silver filler was used as a filler for the conductive adhesive. However, a nickel filler, a copper filler, a silver-palladium filler, or a silver-coated copper filler may be used. Furthermore, as the binder resin, epoxy resin was used. However, acrylic resin, silicon resin, etc. may be used.

As described above, in the mounting structures of Examples 10 to 13, a solvent layer is formed at an adhesion interface between a metal electrode and a conductive adhesive in the course of production. As a result, compared with the mounting structure produced by directly connecting the metal electrode to the conductive adhesive as in the conventional example, the adhesion reliability is remarkably improved, and connection resistance is decreased and stabilized.

In each of the above-mentioned examples, only mounting structures have been described in which a ceramic CSP is mounted on a mother substrate (Examples 10 to 12) and in which a ceramic chip capacitor is mounted on a mother substrate (Example 13). However, it is appreciated that the present invention is applicable to other mounting in which a quad flood package is mounted on a mother substrate, a BGA is mounted on a mother substrate, a lead component is mounted on a mother substrate, a flip chip is mounted between an LSI chip and a carrier substrate, etc.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A mounting structure comprising a first electrode and a second electrode electrically connected to each other via a conductive adhesive, wherein a periphery of an adhesion portion between at least one of the electrodes and the conductive adhesive is covered with an electrical insulating layer, and wherein there is a space between the electrical insulating layer covering the periphery of the adhesion portion between the first electrode and the conductive adhesive and the electrical insulating layer covering the periphery of the adhesion portion between the second electrode and the conductive adhesive, the conductive adhesive extends to the space, and the conductive adhesive in its extending portion adheres to the electrical insulating layer.

2. A mounting structure according to claim 1, wherein the electrical insulating layer is made of at least one material selected from the group consisting of ceramic and resin.

3. A mounting structure according to claim 1, wherein the electrical insulating layer is formed by binder resin from the conductive adhesive.

4. A mounting structure according to claim 1, wherein the first electrode is integrated with an electronic component, and the electrical insulating layer adheres to the electronic component.

5. A mounting structure according to claim 1, wherein the second electrode is integrated with a substrate, and the electrical insulating layer adheres to the substrate.

6. A mounting structure according to claim 1, wherein a maximum height H of the conductive adhesive in a direction extending between the first and second electrodes and a height H1 of the conductive adhesive in the direction extending between the first and second electrodes in an adhesion portion between the conductive adhesive and the electrical insulating layer satisfy the relationship $0.01H < H1 < H/2$.

7. A mounting structure according to claim 1, wherein a maximum dimension D of the conductive adhesive in a direction extending perpendicular to a direction extending between the first and second electrodes and a dimension D1 of the conductive adhesive in a direction extending perpendicular to the direction extending between the first and second electrodes in the adhesion portion between the conductive adhesive and the electrode satisfy the relationship $1.01D1 < D < P/2$, wherein P denotes a connection pitch.

8. A mounting structure according to claim 1, wherein a height of the electrical insulating layer in a direction extending between the first and second electrodes is in a range of 1 $\mu$m to 100 $\mu$m.

9. A mounting structure according to claim 1, wherein a thickness of the electrical insulating layer in a direction extending perpendicular to a direction extending between the first and second electrodes is in a range of 1 $\mu$m to 100 $\mu$m.

10. A mounting structure according to claim 1, wherein the electrical insulating layer is formed continuously between adjacent electrodes.

11. A method for producing a mounting structure for an electronic component comprising a first electrode and a second electrode electrically connected to each other via a conductive adhesive, wherein a periphery of an adhesion portion between at least one of the electrodes and the conductive adhesive is covered with an electrical insulating layer, and wherein there is a space between the electrical insulating layer covering the periphery of the adhesion portion between the first electrode and the conductive adhesive and the electrical insulating layer covering the periphery of the adhesion portion between the second electrode and the conductive adhesive, the conductive adhesive extends to the space, and the conductive adhesive in its extending portion adheres to the electrical insulating layer, the method comprising the steps of:

coating the electrodes with a solvent that dissolves binder resin in the conductive adhesive;

coating the solvent with the conductive adhesive; and curing the conductive adhesive by heating so as to connect the electrodes to the conductive adhesive.

12. A method for producing a mounting structure for an electronic component according to claim 11, wherein the solvent is at least one selected from the group consisting of monovalent alcohols, ketones, esters, glycols, and glycol ethers.

13. A method for producing a mounting structure for an electronic component according to claim 11, wherein the solvent contains a component having a metal-adsorbing functional group or a functional group that chemically reacts with metal.

14. A method for producing a mounting structure for an electronic component according to claim 13, wherein the component has at least one functional group selected from the group consisting of a hydroxyl group, a carboxyl group, a vinyl group, an epoxy group, an amino group, a methacryl group, a mercapto group, an iminodiacetic acid group, an iminodipropionic acid group, an ethylenediamine acetic acid group, and an aminocarboxyl group.

15. A method for producing a mounting structure for an electronic component according to claim 11, wherein the solvent contains a component having a reducing property.

16. A method for producing a mounting structure for an electronic component according to claim 15, wherein the component having a reducing property is at least one selected from the group consisting of reducing sugars, reducing vitamins, hydroxybenzenes, amines, formic acid, polyhydric alcohols, glycol ethers, hydrazines, Rochelle salt, acetoaldehyde, glyoxal, and hypophosphorous acid.

17. A method for producing a mounting structure for an electronic component according to claim 11, wherein coating of the solvent is conducted by spray coating.

18. A method for providing a mounting structure for an electronic component according to claim 11, wherein a coating amount of the solvent is set in a range of 0.01 mg to 1000 mg/cm$^2$ so as to form a solvent layer.

* * * * *